United States Patent

[11] 3,615,913

[72] Inventor Robert R. Shaw
Jeannette, Pa.

[21] Appl. No. 774,302
[22] Filed Nov. 8, 1968
[45] Patented Oct. 26, 1971
[73] Assignee Westinghouse Electric Corporation
Pittsburgh, Pa.

[54] POLYIMIDE AND POLYAMIDE-POLYIMIDE AS A SEMICONDUCTOR SURFACE PASSIVATOR AND PROTECTANT COATING
15 Claims, 4 Drawing Figs.

[52] U.S. Cl. .......... 148/33.3, 29/588, 117/201, 317/234
[51] Int. Cl. .......... H01l 7/00
[50] Field of Search .......... 148/33.3; 317/234; 29/588; 117/201

[56] References Cited
UNITED STATES PATENTS
3,160,520 12/1964 Jantsch et al. .......... 148/33.3
3,411,122 11/1968 Schiller et al. .......... 338/262

*Primary Examiner*—L. Dewayne Rutledge
*Assistant Examiner*—W. W. Stallard
*Attorneys*—F. Shapoe and C. L. Menzemer

ABSTRACT: Exposed portions of PN junctions and exposed surfaces of bodies of semiconductor material are passivated and protected by a coating of a cured, material selected from the group consisting of aromatic polyimides and aromatic polyamide-polyimides.

PATENTED OCT 26 1971 3,615,913

WITNESSES

Wm. B. Sellers.

Donald M. Winegar

INVENTOR

Robert R. Shaw

BY

C. L. Menzemer

ATTORNEY

POLYIMIDE AND POLYAMIDE-POLYIMIDE AS A SEMICONDUCTOR SURFACE PASSIVATOR AND PROTECTANT COATING

BACKGROUND OF THE INVENTION

1. Field of the Invention

This invention relates to protective coating materials for semiconductor elements.

2. Description of the Prior Art

Heretofore, prior art methods provide coating exposed surfaces of semiconductor elements with electrically insulating oxides. Such coatings are thin layers and have virtually no resistance to mechanical abrasion and require relatively expensive processing equipment. In almost all instances a second and a thicker coat of a protective coating material is provided to protect the initial electrically insulating material layer. Silicone greases, varnishes, rubbers and resins which are employed as the overcoating of protective material have been found lacking in desirable physical characteristics.

An object of this invention is to provide a coating material for semiconductor elements which improves the electrical characteristics of the element and protects the elements' exposed surfaces from mechanical abrasion.

Another object of this invention is to provide a coating material which has good resistance to mechanical abrasion as a protective coating for electrical insulator oxides and electrical insulating films deposited on surfaces of semiconductor elements.

Other objects of this invention will, in part, be obvious and will, in part, appear hereinafter.

SUMMARY OF THE INVENTION

In accordance with the teachings of this invention there is provided a semiconductor element comprised of a body of semiconductor material having at least two regions of opposite-type semiconductivity and a PN junction disposed between each pair of regions of opposite type semiconductivity; an end portion of at least one PN junction exposed in a surface of the body; and at least one layer of a cured, protective coating material selected from the group consisting of polyimides and polyamide-polyimides disposed on the exposed end portion of the at least one PN junction.

DESCRIPTION OF THE DRAWINGS

In order to more completely understand the teachings of this invention one should make reference to the drawings, wherein.

DESCRIPTION OF THE INVENTION

Figures 1, 2, 3, 4:
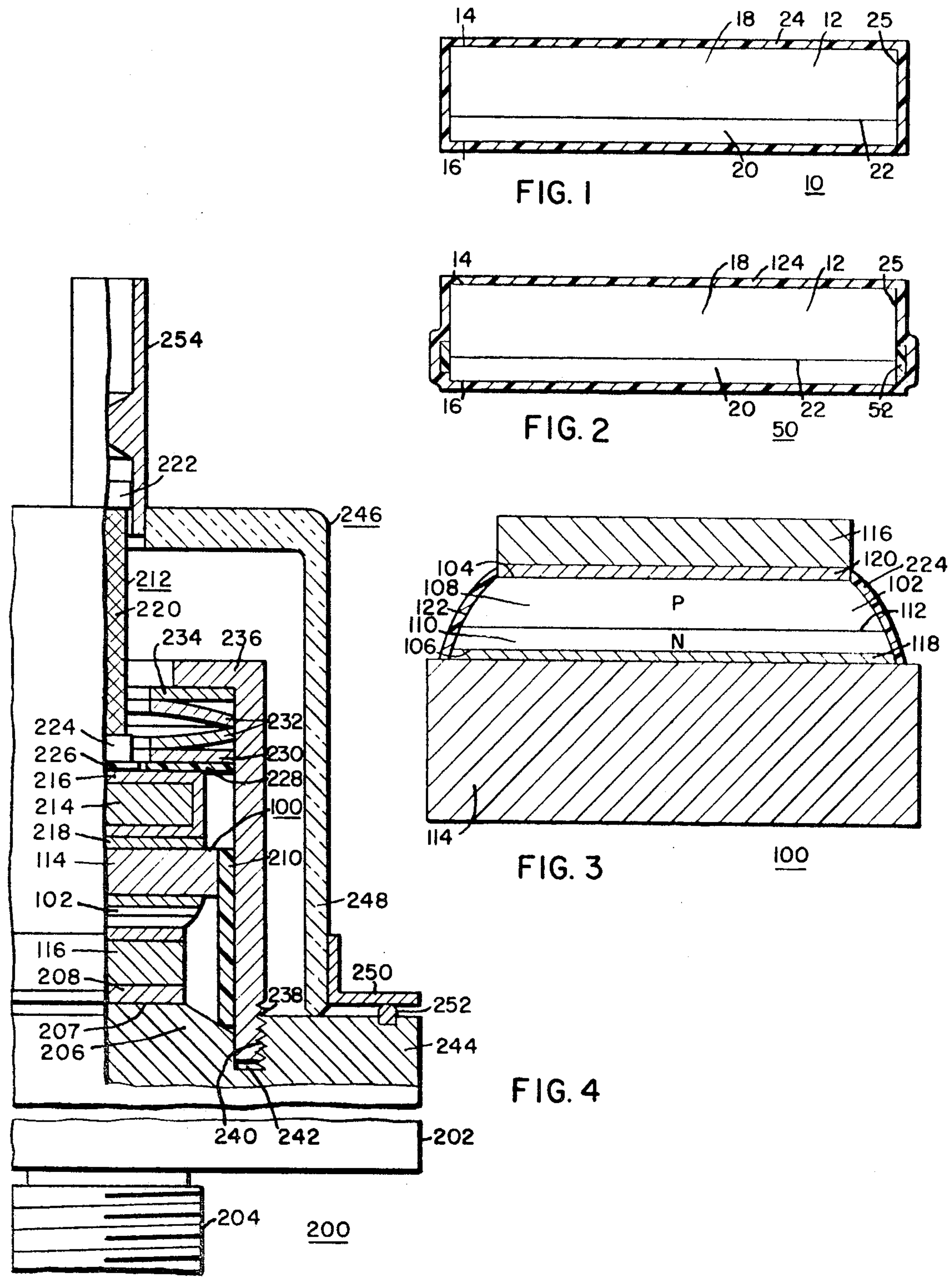
FIGS. 1 and 2 are views in cross section of semiconductor elements made in accordance with the teachings of this invention.
FIG. 3 is a view in cross section of a semiconductor fusion assembly.
FIG. 4 is a view, partly in cross section, of an electrical device embodying a semiconductor fusion assembly made in accordance with the teachings of this invention.

With reference to FIG. 1 there is shown a semiconductor element 10 comprised of a body 12 of semiconductor material prepared by suitable means, such, for example, as by polishing and lapping to parallelism two major opposed surfaces 14 and 16. The body 12 has two, or more regions of opposite type semiconductivity and a PN junction disposed between each pair of regions of opposite-type semiconductivity. The body 12 comprises a suitable semiconductor material, such, for example, as silicon, silicon carbide, germanium, compounds of group III and group V elements and compounds of group II and group VI elements. In order to more fully describe the invention, and for no other purpose, the body 12 will be described as being comprised of silicon semiconductor material having two regions 18 and 20 of opposite-type semiconductivity and a PN junction 22 disposed therebetween.

A protective coating layer 24 is formed on at least surface 25 of the body 12 where the PN junction 22 is exposed. The material of the layer 24 is a high-temperature coating material and is selected from the group consisting of polyimides and polyamide-polyimides.

The material of the layer 24 is preferably applied to the preselected surface area of the body 12 as a solution of a polymeric intermediate. The body 12 with the applied material in solution form is then heated to convert the resinous soluble polymer intermediate to a cured, solid, infusible and insoluble polyimide or a polyamide-imide polymer. Preferably the solution form is prepared by disposing a soluble precursor of an aromatic polyimide or an aromatic polyamide-imide in a suitable solvent such, for example, as dimethylacetamide and N-methyl pyrollidone. Further details on the preparation and cure of aromatic polyimides may be found in the teachings of U.S. Pat. Nos. 3,179,614 and 3,179,634. Details and the preparation of some of the aromatic polyamide-polyimides are taught in U.S. Pat. No. 3,179,635. Further details of suitable solvents for both aromatic polyimides and aromatic polyamide-polymides are taught in the three aforementioned U.S. patents.

A suitable resinous amide-modified polyimide material for the layer 24 has the repeating unit:

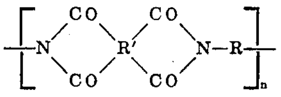

in which *n* is an integer of at least 5 and R represents a divalent radical selected from the group consisting of:

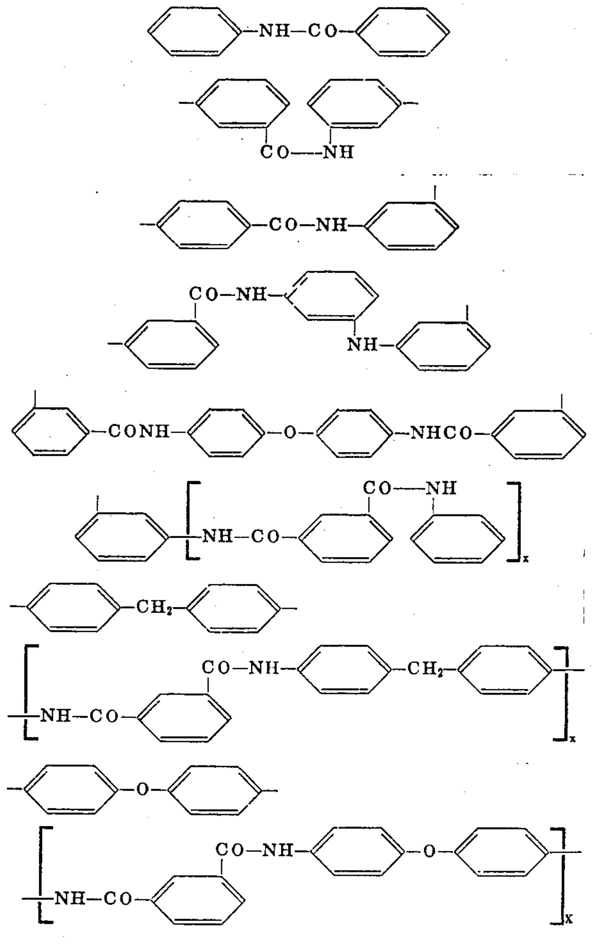

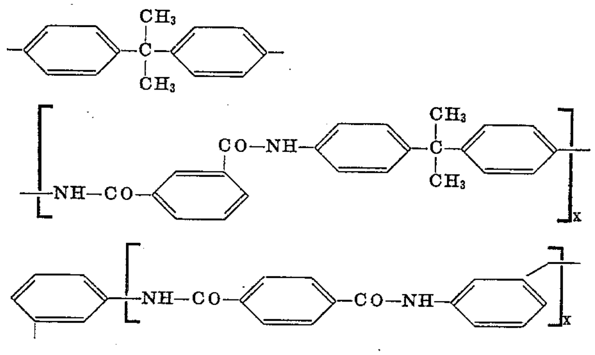

in which $x$ is an integer of from 1 to about 500, and in which R' represents a tetravalent radical selected from the group consisting of:

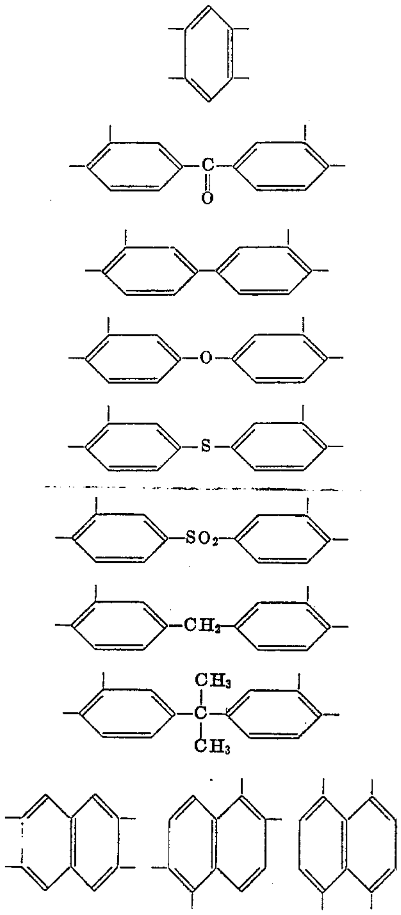

Another suitable resinous amide-modified polyimide for the material of layer 24 is one having the repeating unit:

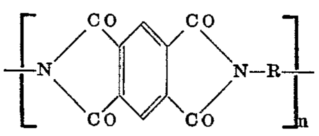

in which $n$ is an integer of at least 5 and R represents a divalent radical selected from the group consisting of:

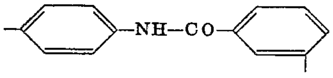

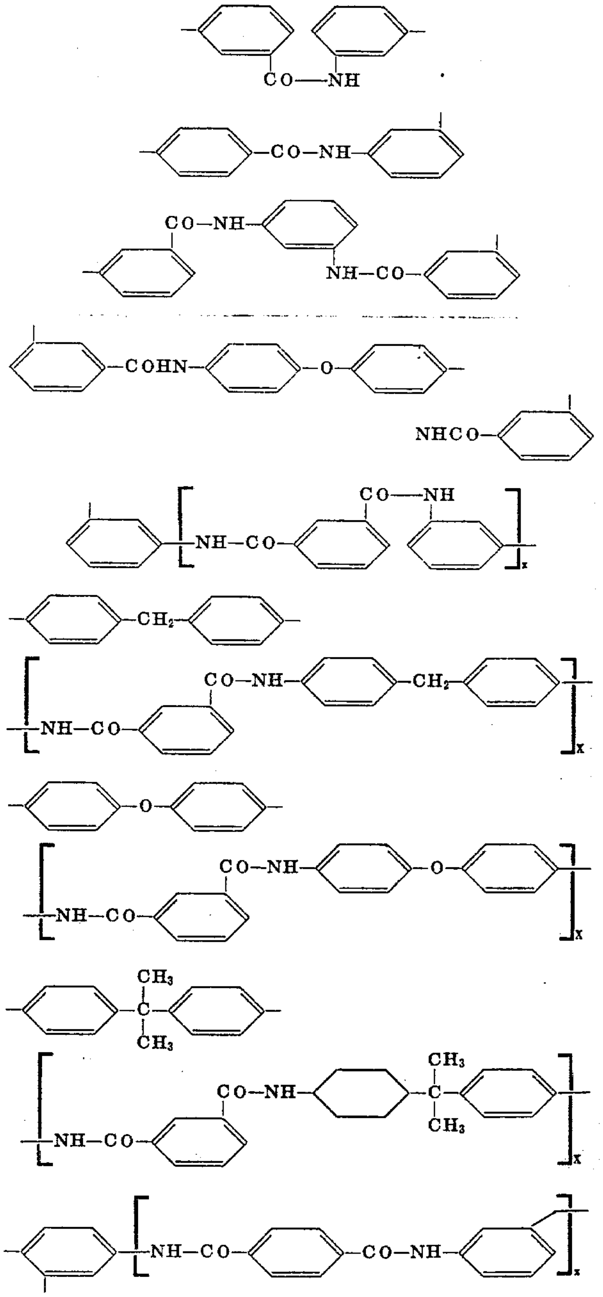

in which $x$ is an integer of from 1 to about 500 and another suitable amide-modified polyimide when cured has the repeating unit:

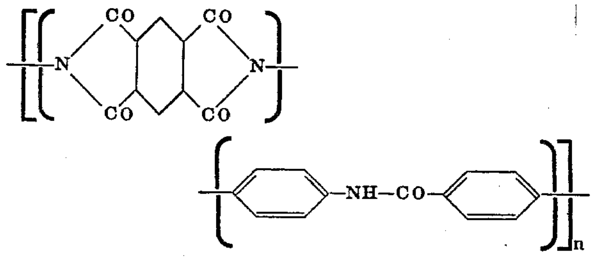

wherein $n$ is an integer of at least 5.

Other suitable resinous aromatic amide-imide polymers suitable for the material of the layer 24 contain the repeating unit:

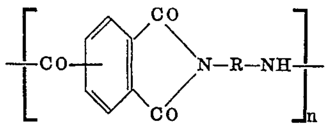

where *n* is an integer of about 50 to 15,000 and *R* is a divalent organic radical composed only of H, C, N, S, and O, for example only divalent radical selected from the group consisting of:

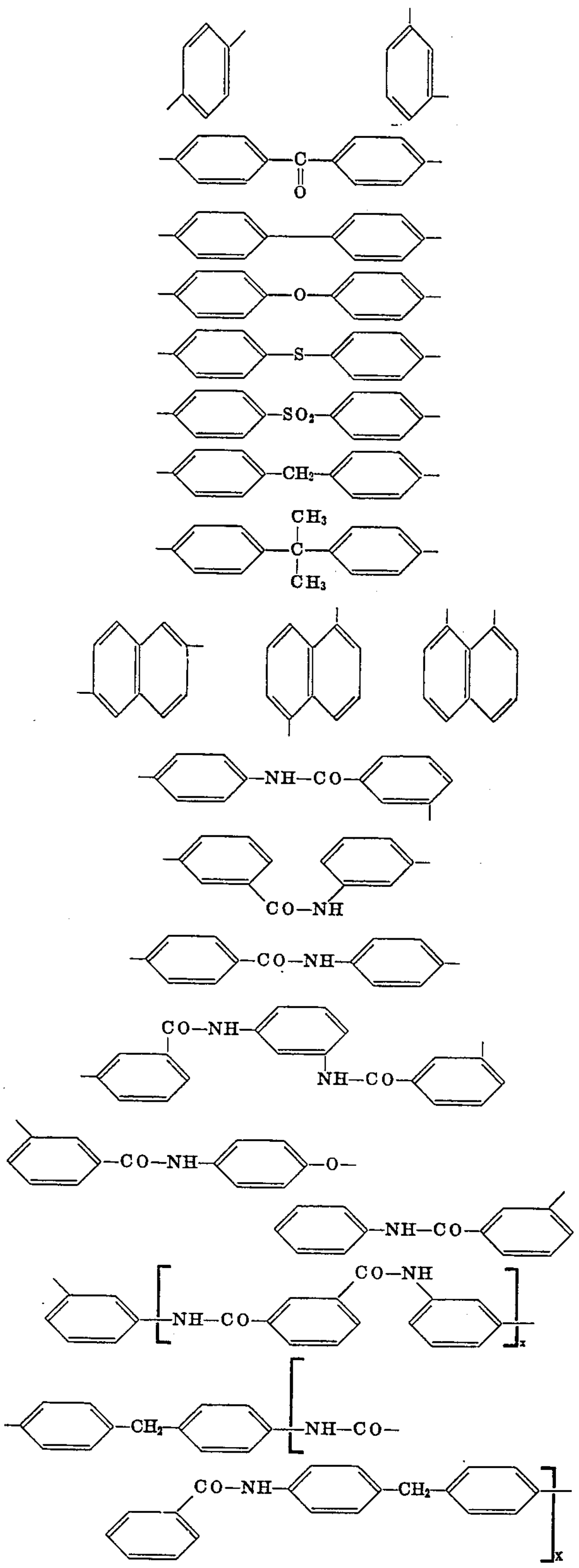

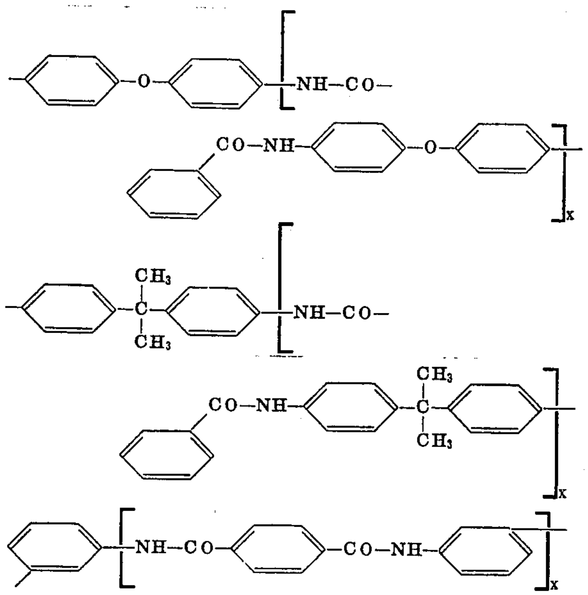

in which *x* is an integer of from 1 to about 500. Copolymers containing two or more of the radicals are also suitable for the material of layer 24.

Suitable resinous polyimides which may be used to form the layer 24 have the recuring unit:

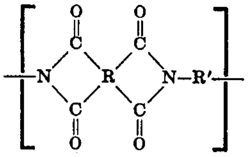

where R is a tetravalent radical containing at least one ring of six carbon atoms, the ring being characterized by benzenoid unsaturation, the four carbonyl groups being attached directly to separate carbonyl atoms in a six-membered benzenoid ring of the R radical and each pair of carbonyl groups being attached to adjacent carbon atoms in a ring of R radical; and wherein R′ is a divalent radical selected from the group consisting of:

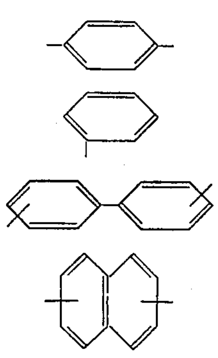

and

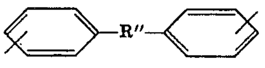

wherein R″ is selected from the group consisting of an alkylene chain having from 1 to 3 carbon atoms,

—O—, —S—, —$SO_2$—,

—N(R''')—, —Si(R''')(R''')—, —O—Si(R''')(R'''')—O—, —O—P(R)(=O)—O—, and

—P(R''')(=O)— wherein R''' and R'''' are selected from the group consisting of alkyl and aryl.

The polyimides and polyamide-imides referenced heretofore form a film for the layer 24 which has high tensile properties, desirable electrical properties, stability to heat and water, and good adherence to the body 12.

Although the protective coating layer need only be applied to the exposed end surfaces of the PN junctions and the contiguous surfaces of the body of semiconductor material it is preferred that the entire exposed surface area of the body have the protective coating layer disposed upon it.

The thickness of the layer 24 is determined by the voltage and current rating of the body 12 of semiconductor material. It is desirable, however, that the layer 24 be a minimum of approximately 1 mil in thickness. For a 1,500 volt thyristor a thickness of about 6 mils is satisfactory.

It is desirable that the layer 24 be formed by curing the applied material in a continuous series of heating steps involving increments of increasing temperature. This is practiced to prevent blistering of the layer 24 which may occur by the entrapment of water vapor or alcohol, one or the other being a reaction product formed by the curing of the polyimide and polyamide-polyimide materials. A preferred heating cycle to cure the applied material is as follows: place the coated semiconductor element in an air circulating furnace and heat at 100° C. for ½ hour minimum; raise the furnace temperature to 150° C. and continue heating for an additional ½ hour minimum; raise the furnace temperature to 200° C. and continue heating for an additional ½ hour minimum; and raise the furnace temperature to the recommended curing temperature for the particular material of the coating layer 24 and continue heating for a period of from 1 to 3 hours, with 2 hours being preferred.

It has been found that where the cured material of the layer 24 has a repeating unit:

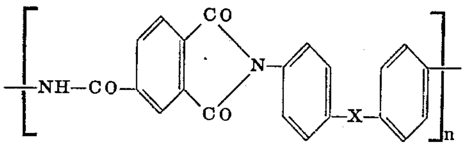

where X is a radical selected from the group consisting of —$CH_2$— and —O—, and $n$ is an integer of from 10 to 100, the final furnace temperature is approximately 300° C. and preferably from 250° C. to 280° C.

The cured material of the layer 24 forms a film which is adherent to the surface of the body 12 and is resistant to abrasion and scratching. Where the cured material has the repeating unit:

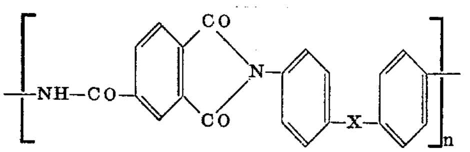

where X and $n$ are defined as before, the film is tough, flexible and has good thermal stability permitting the element 10 to operate at a junction temperature in excess of 200° C.

If desired, layer 24 may include a filler material, preferably an electrically insulating material having the same dielectric constant as, or less than that of the protective coating. The filler is uniformly distributed throughout, the polyimide and polyamide-polyimide materials of the layer 24. Also suitable are those materials known to have relatively good ability to resist electrical conduction although their dielectric constant is higher than that of the material of the layer 24. Suitable electrically insulating materials, in finely divided or pulverized form, which can be used as a filler material are aluminum oxide, silicon oxide, glass fibers, boron nitride, quartz, mica, magnesium oxide and reactivated polytetrafluorethylene.

The electrically insulating filler material preferably should not exceed 64 percent, by volume, of the layer 24. A preferred range of from 40 percent to 50 percent by volume is desirable as this mixture of filler material, the polyimide and polyamide-polyimide, has the best working consistency.

With either a filled or unfilled polyimide or polyamide-polyimide material, the electrical properties of the element 10 is improved and the element's functional operating temperature range increased to a range extending from approximately −100° C. to approximately 200° C. Additionally, the hardness, the abrasion and scratch resistance, the adhesive capability, and the thermal stability of the material of the layer 24 makes it a suitable material as a protective coating layer for an electrically insulating film such, for example, as silicon oxide or silicon nitride films employed to passivate selected surface areas of semiconductor devices.

Referring now to FIG. 2 there is shown a semiconductor element 50 which is an alternate embodiment of the element 10. The only difference between the elements 10 and 50 is a layer 52 of electrically insulating material disposed on at least the exposed end portions of the PN junction 22 to minimize reverse current leakage across the exposed end portions. The material of the layer 52 is one selected from the group consisting of silicon oxide, silicon nitride and aluminum nitride. A layer 124 of either a filled or an unfilled polyimide or a polyamide-polyimide is disposed on top of the layer 52.

Referring now to FIG. 3 there is shown a fusion assembly 100 comprised of a body 102 of semiconductor material having opposed major surfaces 104 and 106 comprising a top and a bottom surface respectively. The body 102 has a first region 108 of first type semiconductivity, a second region 110 of second-type semiconductivity, and a PN junction 112 disposed between the two regions 108 and 110. A first electrically and thermally conductive contact 114 is joined to the bottom surface 106 of the body 102 by a layer 118 of a suitable solder material. The contact 114 acts also as a support member for the body 102. A second electrically and thermally conductive contact 116 is joined to the top surface 104 of the body 102 by a layer 120 of a suitable solder material. Exposed surface 122 and portions of the PN junction 112 exposed therein are protected by a layer 224 of a cured resin selected from the group consisting of aromatic polyimides and aromatic polyamide-polyimides with or without filler materials contained therein.

As an example of the teachings of this invention, 250 semiconductor element fusion assemblies were prepared to compare the teachings of this invention with the prior art teachings. Each of the fusion assemblies had the same structural features as the fusion assembly 100 of FIG. 3 except for the layer 224 of protective coating material.

Each fusion assembly consisted of a body of silicon semiconductor material of P-type semiconductivity polished and lapped to parallelism to produce the opposed major surfaces 104 and 106. Following a diffusion process the body of silicon consisted of a P-type region 108, and an N-type region 110, and a PN junction 112 disposed between the two regions 108 and 110.

Employing a vacuum fusion joining operation, the electrically and thermally conductive contacts 114 and 116 were joined to the body 102 by the respective solder layers 118 and 120. The contact 114 was made of a silver-tungsten alloy and the contact 116 was made of molybdenum. The solder layer 118 consisted of a silver-lead-antimony alloy. The solder layer 120 consisted of an alloy of aluminum and boron.

The fusion assemblies were sandblasted to contour the peripheral side surface of the body of silicon, spin etched, rinsed in deionized water and dried by a blast of nitrogen gas. All the fusion assemblies were tested and found to have a minimum voltage capability of 1,000 volts.

One hundred and twenty-five of the fusion assemblies had the exposed surface 122 coated with a prior art protective coating material of a high purity silicone varnish. The high-purity silicone varnish was a room temperature vulcanizing rubber. The assemblies were air dried for 20 hours and then baked at 260°±5° C. for 24 hours.

The remaining 125 fusion assemblies each had the exposed surface 122 of the body 102 coated with a solution of a polyamide-polyimide polymer intermediate containing 24 to 26 percent solids which when cured would have the repeating radical:

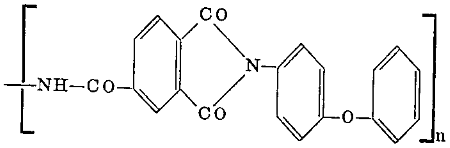

where *n* is defined as before. The coated fusion assemblies were placed in an air-circulating furnace and heated to 100° C. and held at that temperature for ½ hour. At the end of the ½ hour, the furnace temperature was raised to 150° C. and the assemblies 100 were heated for another ½ hour. At the end of the ½ hour at temperature, the furnace temperature was raised to 200° C. and the assemblies baked at this temperature for ½ hour. Upon completion of the at least ½ hour baking period, the furnace temperature was raised to 250° C. and the assemblies were baked for 2 hours and then cooled to room temperature.

All of the 250 assemblies 100 were tested electrically and the results obtained were as follows:

55 fusion assemblies having the layer of silicon resin applied to the surface 122 or 42 percent of the assemblies made, failed the reverse voltage test of 1,000 volts and allowable reverse current leakage of 10 milliamperes at 190° C. case temperature.

102 fusion assemblies made in accordance with the teachings of this invention passed the same electrical tests performed on the prior art devices.

All of the fusion assemblies which passed the previous electrical tests were again tested for the same voltage and current requirements except the testing temperature was −40° C. Four of the remaining assemblies of the prior art fusion assemblies failed but all of the remaining fusion assemblies made in accordance with the teachings of this invention passed the low-temperature electrical tests.

The protective coating layer 224 of cured polyamide-polyimide remained flexible at the low temperature and was scratch and abrasion resistant at all temperatures within normal operating temperature ranges for the fusion assemblies. Additionally the operating junction temperature of the fusion assembly was found to be approximately 200° C. whereas the composite layer 224 having the room temperature vulcanizing rubber overcoating permits an operation junction temperature of only approximately 150° C.

Often traces of metal ions still remain on the surface 122 of the fusion assembly 100 even after one or more surface cleaning processes. Sequestering agents, such, for, example as alizarin may be added to the solution of a polymeric intermediate of an aromatic polyimide or an aromatic polyamide-polyimide before applying the solution to the surface 122. The sequestering agent, by chelation, renders the metal ions on the surface 122 inert. Alizarin is added to the solution in the quantity of up to 1 percent by weight. One half percent by weight of alizarin in the solution has been found to work well for semiconductor devices having high-voltage—low reverse current properties, where the magnitude of the current is measured in microamperes and nanoamperes. In plotting the reverse voltage curves for these devices, the "knee" of the curve is very sharp compared to the "soft knee" of the curve exhibited by devices in which the polyimide or polyamide-polyimide coating does not contain the alizarin. The curing cycle for this modified solution is the same as for the unmodified solution.

The fusion assembly 100 of FIG. 3 made in accordance with the teachings of this invention may be encapsulated within several different electrical devices. One form of encapsulation of the fusion assembly 100 is a Compression Bonded Encapsulated electrical device 200 shown in FIG. 4.

With reference to FIG. 4, the device 200 is comprised of a massive metal member 202, which member 202 may be made of a thermally and electrically conductive metal such, for example, as copper, brass, aluminum, aluminum alloys, and steel alloys. A threaded stud portion 204 is integral with, or affixed to, the member 202 for assembling the device 200 into electrical apparatus. The upper side of the member 202 is provided with a pedestal portion 206.

A metal layer 208 is disposed on a top surface 207 of the pedestal 206 and the fusion assembly 100 is centered thereon by a tubular electrically insulating member 210 disposed also on the pedestal 206 and about the outer periphery of the layer 208. The layer 208 comprises a suitable electrically and thermally conductive metal such, for example, as silver. The layer 208 may also be disposed on the pedestal 206 by other such suitable means as, for example, plating. A suitable material for the tubular member 210 is polytetrafluorethylene. An electrical contact assembly 212 is disposed on the contact 114. The contact assembly 212 consists of an electrically and thermally conductive body 214 of a suitable material such, for example, as molybdenum, encased within a layer 216 of nickel having a layer 218 of gold disposed on, and diffused into, at least that portion of the nickel in contact with the electrical contact 114. A braided electrical conductor 220 having electrically conductive end caps 222 and 224 affixed thereto is joined to the plated contact body 214 by a layer 226 of a solder alloy of silver and gold.

An apertured electrically insulating washerlike member 228 is disposed about the conductor 220 and on the plated body 214. A first apertured metal thrust washer 230 is disposed about the conductor 220 and on the insulating member 228. At least one convex apertured spring member 232 is disposed about the conductor 220 and on the thrust washer 230. A second apertured metal thrust member 234 is disposed on the at least one convex spring member 232.

A cup-shaped member 236 having external threads at 238 is placed over the electrical conductor 220 and the external threads 238 are screwed down onto a threaded portion 240 of a slot 242 located between the pedestal 206 until a desired predetermined force is applied to the plated contact body 214. This predetermined force resiliently urges the plated body 214, the fusion assembly 100, and the pedestal 206 of the member 202 into a pressure electrical and thermal conductive relationship with each other.

The device 200 is completed by hermetically encapsulating the fusion assembly 100 within a header assembly 246. The header assembly 246 is comprised of ceramic insulator 248 joined to an outwardly extending metal flanged portion 250. The flanged portion 250 is welded to a weld ring 252 affixed to the massive metal member 202. A hollow stem member 254 affixed to the ceramic insulator 248 is fitted over the conductor 220 and is electrically connected thereto by compressing or rolling a part of the stem 254 about the end cap 222.

I claim as my invention:

1. A semiconductor element comprised of a body of semiconductor material having at least two regions of opposite-type semiconductivity and a PN junction disposed between each pair of regions of opposite type semiconductivity;

an end portion of at least one PN junction exposed at a surface of said body; and at least one layer of a protective coating material disposed on the exposed end portion of the at least one PN junction, said layer comprising a cured resin selected from the group consisting of aromatic polyimides and aromatic polyamide-polyimides.

2. The semiconductor element of claim 1 in which said layer of protective coating material includes a sequestering agent contained therein.

3. The semiconductor element of claim 1 in which said layer of protective coating material is an aromatic polyamide-polyimide having the repeating unit:

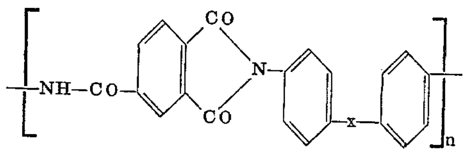

where x is a radical selected from the group consisting of

—$CH_2$— and —O— , and

*n* is an integer of from 10 to 100.

4. The semiconductor element of claim 3 in which said layer of protective coating material includes a sequestering agent contained therein.

5. The semiconductor element of claim 4 in which said sequestering agent is alizarin.

6. The semiconductor element of claim 1 including a finely divided electrically insulating material uniformly distributed throughout the layer of protective coating material.

7. The semiconductor element of claim 6 in which said filler material comprises up to 64 percent by volume of the layer of protective coating material.

8. The semiconductor element of claim 6 in which said filler material comprises from 40 percent to 50 percent by volume of the layer of protective coating material.

9. The semiconductor element of claim 6 in which said electrically insulating material is a material selected from the group consisting of aluminum oxide, silicon oxide, glass fibers, boron nitride, quartz, mica, magnesium oxide, and reactivated polytetrafluorethylene.

10. The semiconductor element of claim 3 including a finely divided electrically insulating material uniformly distributed throughout the layer of protective coating material.

11. The semiconductor element of claim 10 in which said filler material comprises up to 64 percent by volume of the layer of protective coating material.

12. The semiconductor element of claim 10 in which said filler material comprises from 40 percent to 50 percent by volume of the layer of protective coating material.

13. The semiconductor element of claim 10 in which said electrically insulating material is a material selected from the group consisting of aluminum oxide, silicon oxide, glass fibers, boron nitride, quartz, mica, magnesium oxide, and reactivated polytetrafluorethylene.

14. The semiconductor element of claim 1 including a layer of an electrically insulating material selected from the group consisting of aluminum nitride, silicon oxide and silicon nitride deposited on the exposed end portion of the at least one PN junction beneath the layer of protective coating material.

15. The semiconductor element of claim 3 including a layer of an electrically insulating material selected from the group consisting of aluminum nitride, silicon oxide and silicon nitride deposited on the exposed end portion of the at least one PN junction and beneath the layer of protective coating material.